(12) United States Patent
Jacobbson et al.

(10) Patent No.: US 10,182,494 B1
(45) Date of Patent: Jan. 15, 2019

(54) LANDLESS VIA CONCEPT

(71) Applicant: Flex Ltd., Singapore (SG)

(72) Inventors: Henrik Jacobbson, Kullavik (SE); Fa Chao OuYang, Guangdong (CN)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 15/698,430

(22) Filed: Sep. 7, 2017

(51) Int. Cl.
  *H05K 1/02* (2006.01)
  *H05K 3/44* (2006.01)
  *H05K 3/46* (2006.01)
  *H05K 3/00* (2006.01)

(52) U.S. Cl.
  CPC ............ *H05K 1/021* (2013.01); *H05K 3/445* (2013.01); *H05K 3/4647* (2013.01); *H05K 3/0017* (2013.01); *H05K 2201/0227* (2013.01); *H05K 2201/066* (2013.01)

(58) Field of Classification Search
  CPC .............................. H05K 1/021; H05K 3/445
  USPC .................................................. 174/262–266
  See application file for complete search history.

(56) References Cited

U.S. PATENT DOCUMENTS

| | | | |
|---|---|---|---|
| 6,541,712 B1 | 4/2003 | Gately | |
| 6,706,564 B2 * | 3/2004 | Kim, II | H01L 21/4857 174/255 |
| 8,042,445 B2 | 10/2011 | Lin | |
| 8,222,537 B2 | 7/2012 | Dudnikov, Jr. | |
| 8,302,301 B2 | 11/2012 | Lau | |
| 8,882,954 B2 | 11/2014 | Lee | |
| 2006/0043567 A1 | 3/2006 | Palanduz | |
| 2008/0217708 A1 | 9/2008 | Reisner | |
| 2009/0004438 A1 | 1/2009 | Urakawa | |
| 2010/0181104 A1 | 7/2010 | Hotta | |
| 2012/0234587 A1 | 9/2012 | Nakamura | |
| 2014/0301053 A1 | 10/2014 | Iida | |
| 2015/0014029 A1 | 1/2015 | Iwayama | |
| 2015/0047884 A1 | 2/2015 | Nagaura | |
| 2016/0021762 A1 | 1/2016 | Kallman | |
| 2016/0088729 A1 | 3/2016 | Kobuke | |

FOREIGN PATENT DOCUMENTS

KR  100891814 B1  4/2009

OTHER PUBLICATIONS

Non-Final Office Action, dated May 1, 2018, U.S. Appl. No. 15/159,665, filed May 19, 2016, Applicant: Jiawen Chen, 8 pages.

(Continued)

*Primary Examiner* — Jeremy C Norris
(74) *Attorney, Agent, or Firm* — Haverstock & Owens LLP

(57) ABSTRACT

A heat sink is mounted to a PCB for thermal heat removal. The PCB is configured with plated through hole vias within a footprint of the heat sink. The plated through hole vias can include thermal via types and signal carrying via types. The signal carrying via types are landless vias on the PCB back side configured to eliminate physical and electrical contact between the plated through hole via and the heat sink. The landless via is configured by removing a conductive annular ring on the back side of the PCB, and then covering this area with an insulating material such as soldermask. The insulating material forms an insulation cap between the via side wall plating and the attached heat sink.

21 Claims, 5 Drawing Sheets

(56) References Cited

OTHER PUBLICATIONS

Non-Final Office Action, dated Feb. 27, 2018, U.S. Appl. No. 15/087,793, filed Mar. 31, 2016, Applicant: Pui Yin Yu, 11 pages.
Non-Final Office Action, dated Nov. 28, 2017, U.S. Appl. No. 14/995,087, filed Jan. 13, 2016, Applicant: Pui Yin Yu, 11 pages.

* cited by examiner

LANDLESS VIA CONCEPT

FIELD OF THE INVENTION

The present invention is generally directed to printed circuit boards. More specifically, the present invention is directed to printed circuit boards having landless vias.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate laminations. Conductors on different layers can be interconnected with plated-through holes called vias.

FIG. 1 illustrates a cut out side view of a portion of a conventional PCB. The PCB 2 includes a plurality of stacked layers, the layers made of non-conductive layers 4, 6 and conductive layers 8. The non-conductive layers can be made of prepreg or base material that is part of a core structure, or simply core. Prepreg is a fibrous reinforcement material impregnated or coated with a thermosetting resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material patterned on one or both sides. A laminated stack is formed by stacking multiple core structures with intervening prepreg and then laminating the stack. A via 10 is then formed by drilling a hole through the laminated stack and plating the wall of the hole with electrically conductive material, such as copper. The resulting plating 12 interconnects the conductive layers 8. In the exemplary application shown in FIG. 1, the plating 12 extends uninterrupted through the entire thickness of the via 10, thereby providing a common interconnection with each and every conductive layer 8. In other applications, one or some of the conductive layers do not extend laterally to the via and therefore are not connected to the plating within the via for interconnection with other conductive layers. In general, a conductive layer can represent a patterned interconnect layer, a ground plane or a power plane.

A significant consideration when designing a PCB and PCB assembly is a thermal solution for dissipating heat generated by such devices. Many electronic products need to consider the thermal solution in order to make the system work properly. In many applications, the thermal problem becomes particularly acute, such as for high power systems and related IC packaging. In such applications, a heat sink is often attached on the back side of the PCB. Heat generated by electronic components mounted to the front side of the PCB can be transferred to the heat sink using copper plated vias or copper coins included within the PCB. FIG. 2 illustrates a cut out side view of a portion of a conventional PCB with a heat sink attached. For simplicity, the individual stacked layers of the PCB are not shown. The PCB 18 includes a plated through via 20 with via side wall plating 22 and an annular ring 24 on both the front side and the back side of the PCB 18. Soldermask 26 is also shown in the front side of the PCB 18. A copper heat sink 30 is attached to the backside of the PCB 18 by thermally conductive adhesive 28. Heat generated on the front side of the PCB 18, such as by attached electronic components (not shown) is transferred through the via 20 by the via side wall plating 22 to the annular ring 24 on the back side of the PCB 18 and to the thermally attached heat sink 30. The via 20 functions in this case as a thermal via, not as a signal carrying via, or simply signal via, as with the signal via 10 shown in FIG. 1. A via functioning as a signal via cannot be connected to the heat sink because the heat sink is also electrically conductive and would short circuit the signal via.

However, as circuit densities increase, the area of the PCB under the heat sink may also be need for signal vias. In this case, such signal vias need to be designed such that there is no conductive contact between the signal via at the backside of the PCB and the heat sink. This can be accomplished by either removing the portion of the heat sink that is positioned over the signal via or by removing the via plating at the backside of the PCB. To remove the via plating, a back drill process is performed where a hole is drilled into the back side of the PCB at the signal via. The drilled hole diameter is wider than the via diameter such that the drilled hole removes a portion of the via side wall plating in addition to at least a portion of the via back side surface annular ring. FIG. 3 illustrates a cut out side view of a portion of a conventional PCB having the via back drilled. The PCB 42 is similar to the printed circuit board 18 of FIG. 2 except that a hole 40 has been back drilled into the PCB 32. The back drilled hole 40 removes a portion of the annular ring 44 at the back side surface of the via 34 as well as a corresponding portion of the via side wall plating 38 in the via 34 thereby disconnecting the remaining via side wall plating 38 from the heat sink 42.

In some applications, after the back drilling is performed the via can be filled from the backside, such as with soldermask or epoxy. FIG. 4 illustrates the PCB of FIG. 3 with the back drilled hole 40 filled with soldermask 54. This application is typically used if the contact pad, annular ring 44, on the front side (bottom surface in FIG. 4) is a solder pad where solder is applied. The soldermask within the via prevents the solder from extending through the via to the copper heat sink. FIG. 5 illustrates the PCB of FIG. 3 with the back drilled hole 40 and the remainder of the via 34 completely filled with epoxy 56. Additionally, a copper cap 58 is applied (plated) on the front side (bottom surface in FIG. 5) over the epoxy filled via. The copper cap 58 and annular ring 44 function as a solder pad.

Although effective in disconnecting the plated via from an attached heat sink, back drilling is time consuming and expensive. As via densities increase, such problems with back drilling become more acute.

SUMMARY OF THE INVENTION

A heat sink is mounted to a PCB for thermal heat removal. The PCB is configured with plated through hole vias within a footprint of the heat sink. The plated through hole vias can include thermal via types and signal carrying via types. The signal carrying via types are landless vias on the PCB back side configured to eliminate physical and electrical contact between the plated through hole via and the heat sink. The landless via is configured by removing a conductive annular ring on the back side of the PCB, and then covering this area with an insulating material such as soldermask. The insulating material forms an insulation cap between the via side wall plating and the attached heat sink.

In an aspect, an electronic device is disclosed that includes a circuit board and a heat sink. The circuit board includes a plurality of stacked layers where the plurality of stacked layers comprise a first outer layer surface and an opposing second outer layer surface, a via formed through the plurality of stacked layers from the first outer layer surface to the second outer layer surface, a conductive annular ring on the first outer layer surface, and an insulating layer on the second outer layer surface and covering an end of the via at the second outer layer surface. Side walls of the via are plated with conductive material from the first outer layer surface to at least proximate the second outer layer surface. The conductive annular ring surrounds the via and is coupled to the side wall plating of the via. The heat sink is coupled to the insulating layer and to the second outer layer surface. In some embodiments, a portion of the via side wall adjacent the second outer layer surface is vacant of side wall plating. In some embodiments, the insulating layer extends into the portion of the via side wall adjacent the second outer surface. In some embodiments, the via is filled with an insulating material. In some embodiments, the insulating material comprises an epoxy resin. In some embodiments, the circuit board also includes a conductive cap coupled to the conductive annular ring and covering an end of the via at the first outer layer surface. In some embodiments, each of the conductive layers is pattern etched.

In another aspect, an electronic device is disclosed that includes a circuit board and a heat sink. The circuit board includes a laminated stack comprising a plurality of non-conducting layers and a plurality of conductive layers, a via, a conductive annular ring, and an insulating layer. The laminated stack further comprises a first outer layer surface and an opposing second outer layer surface having a plurality of patterned conductive interconnects. The via is formed through the laminated stack from the first outer layer surface to the second outer layer surface, wherein side walls of the via are plated with conductive material from the first outer layer surface to proximate the second outer layer surface. The conductive annular ring is on the first outer layer surface, the conductive annular ring surrounding the via and coupled to the side wall plating of the via. The insulating layer is on the second outer layer surface and laterally between the plurality of patterned conductive interconnects, at least a first surface of the plurality of patterned conductive interconnects are exposed from the insulating layer, wherein the insulating layer covers the via. The heat sink is coupled to the insulating layer and to the exposed first surface of the plurality of patterned conductive interconnects. In some embodiments, a portion of the via side wall adjacent the second outer layer surface is vacant of side wall plating. In some embodiments, the insulating layer extends into the portion of the via side wall adjacent the second outer surface. In some embodiments, the via is filled with an insulating material. In some embodiments, the insulating material comprises an epoxy resin. In some embodiments, the circuit board also includes a conductive cap coupled to the conductive annular ring and covering an end of the via at the first outer layer surface. In some embodiments, each of the conductive layers is pattern etched. In some embodiments, the via side wall plating forms electrical interconnections with conductive layers intersecting the via.

In yet another aspect, a method of manufacturing a circuit board is disclosed. The method includes forming a circuit board having a plurality of stacked layers, wherein the plurality of stacked layers comprises a first outer conductive layer and an opposing second outer conductive layer. The method also includes forming a through hole via through the plurality of stacked layers, plating side walls of the through hole via, and patterning the first outer conductive layer to form a conductive annular ring surrounding the via and coupled to the side wall plating of the via. The method also includes patterning the second outer conductive layer to remove conductive material overlapping an end of the via at the second outer conductive layer such that side wall plating of the via is disconnected from the second outer conductive layer, applying an insulation material at the end of the via at the second outer conductive layer to form an insulation cap, and mounting a heat sink to the second outer conductive layer, wherein a position of the heat sink overlaps the via. In some embodiments, the method also includes filling the plated through hole via with an insulating material. In some embodiments, the method also includes forming a conductive cap to the conductive annular ring, wherein the conductive cap covers an end of the via. In some embodiments, the first outer conductive layer is pattern etched and the second outer conductive layer is pattern etched.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board with landless vias. Those of ordinary skill in the art will realize that the following detailed description of the printed circuit board is illustrative only and is not intended to be in any way limiting. Other embodiments of the printed circuit board with landless vias will readily suggest themselves to such skilled persons having the benefit of this disclosure.

Reference will now be made in detail to implementations of the printed circuit board with landless vias as illustrated in the accompanying drawings. The same reference indicators will be used throughout the drawings and the following detailed description to refer to the same or like parts. In the interest of clarity, not all of the routine features of the implementations described herein are shown and described.

It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
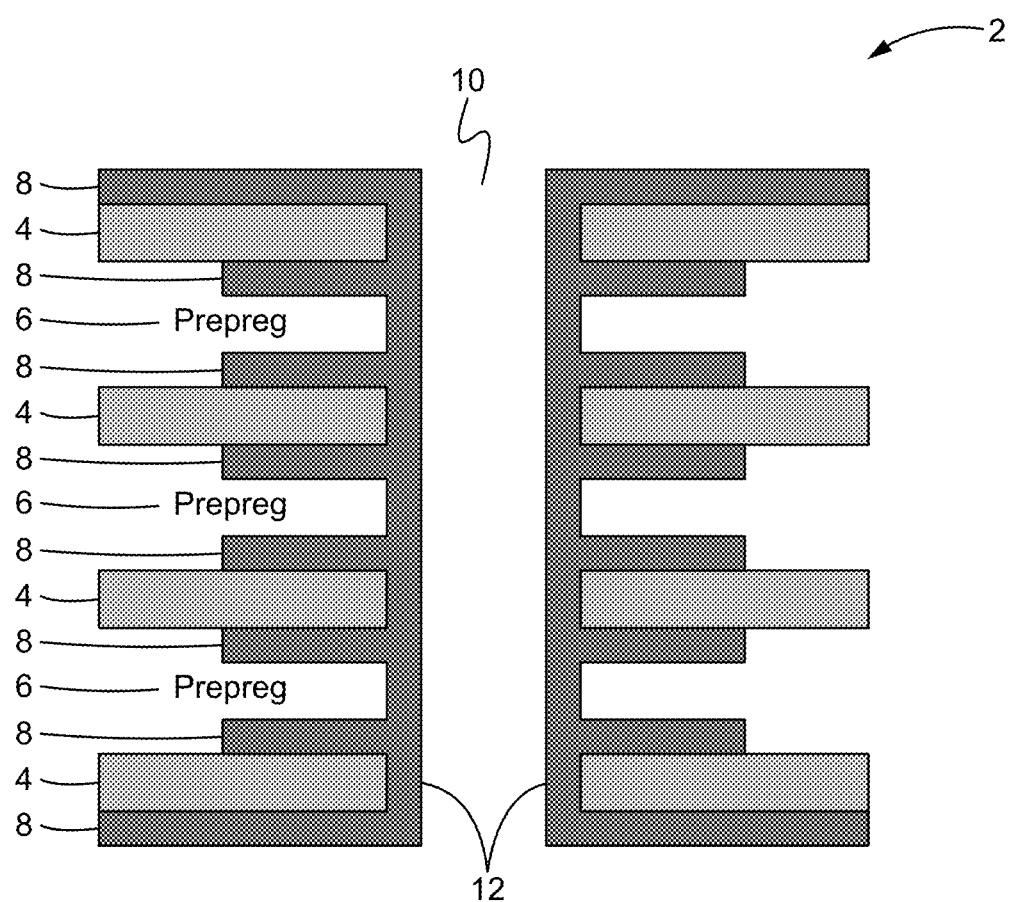
FIG. 1 illustrates a cut out side view of a portion of a conventional printed circuit board.
Figure 2:
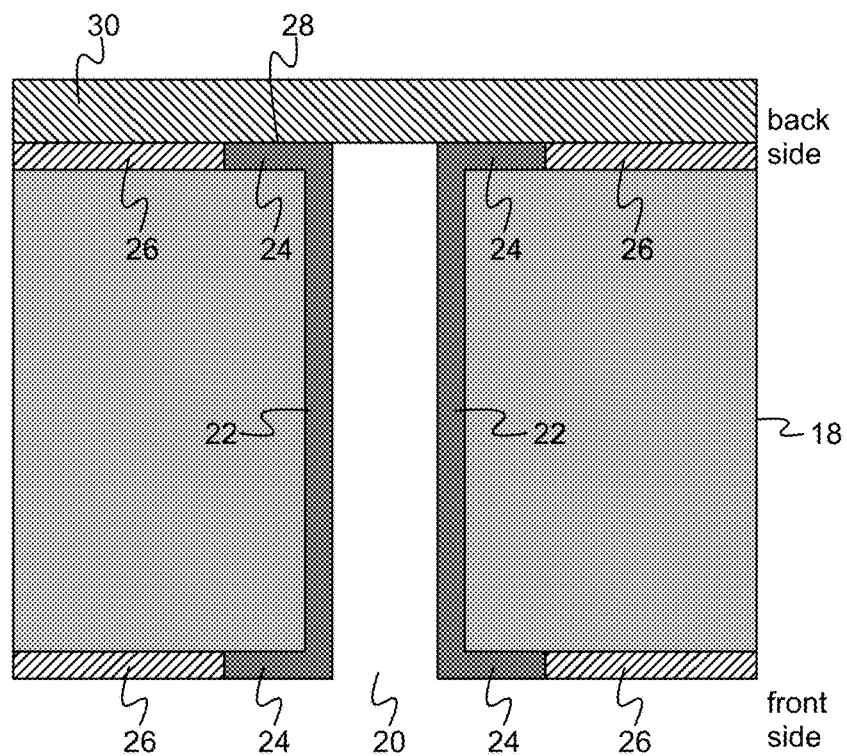
FIG. 2 illustrates a cut out side view of a portion of a conventional PCB with a heat sink attached.
Figure 3:
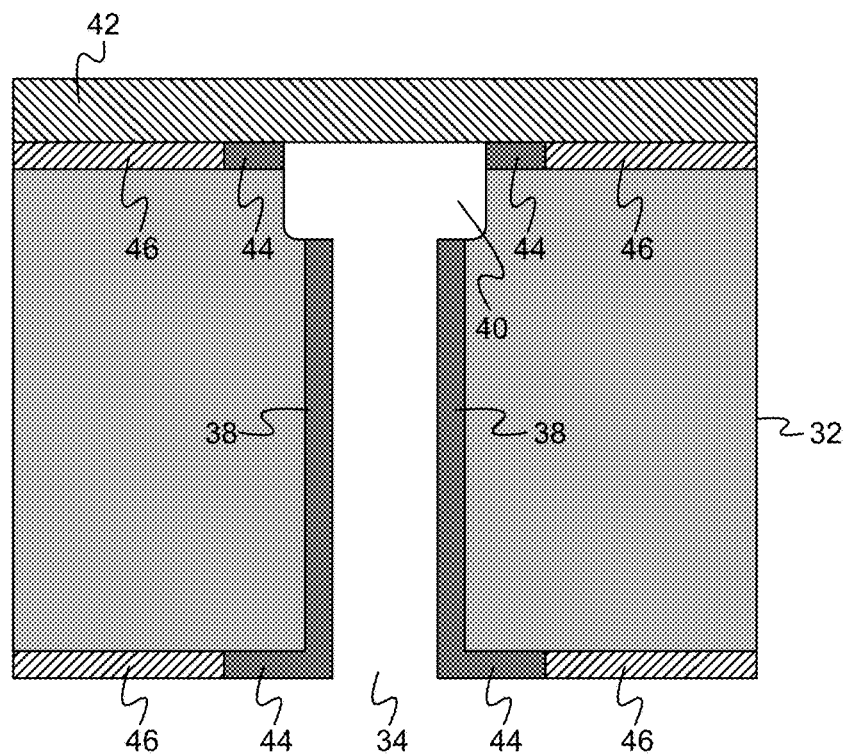
FIG. 3 illustrates a cut out side view of a portion of a conventional PCB having the via back drilled.
Figure 4:
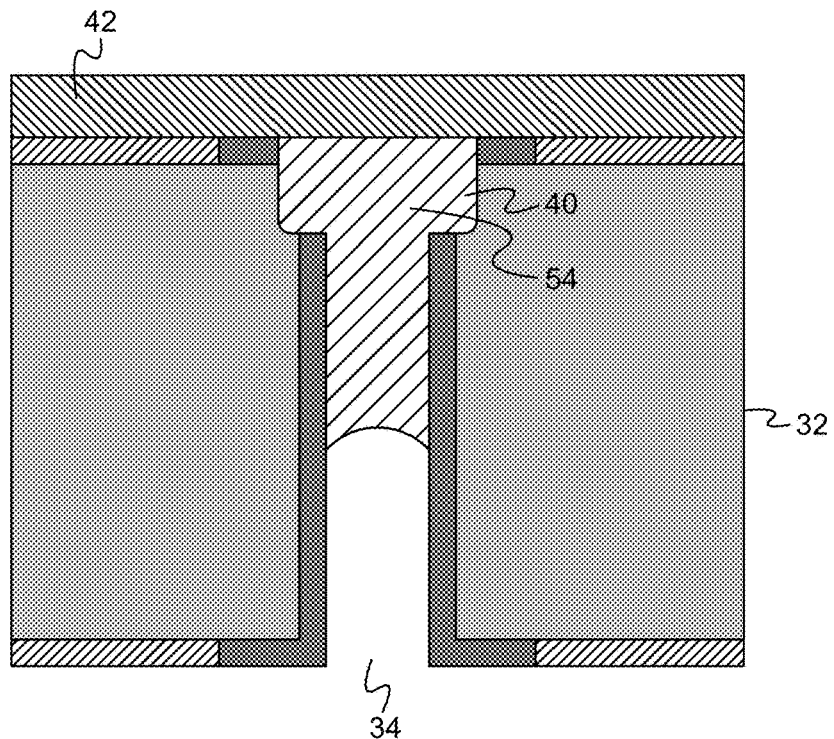
FIG. 4 illustrates the PCB of FIG. 3 with the back drilled hole filled with soldermask.
Figure 5:
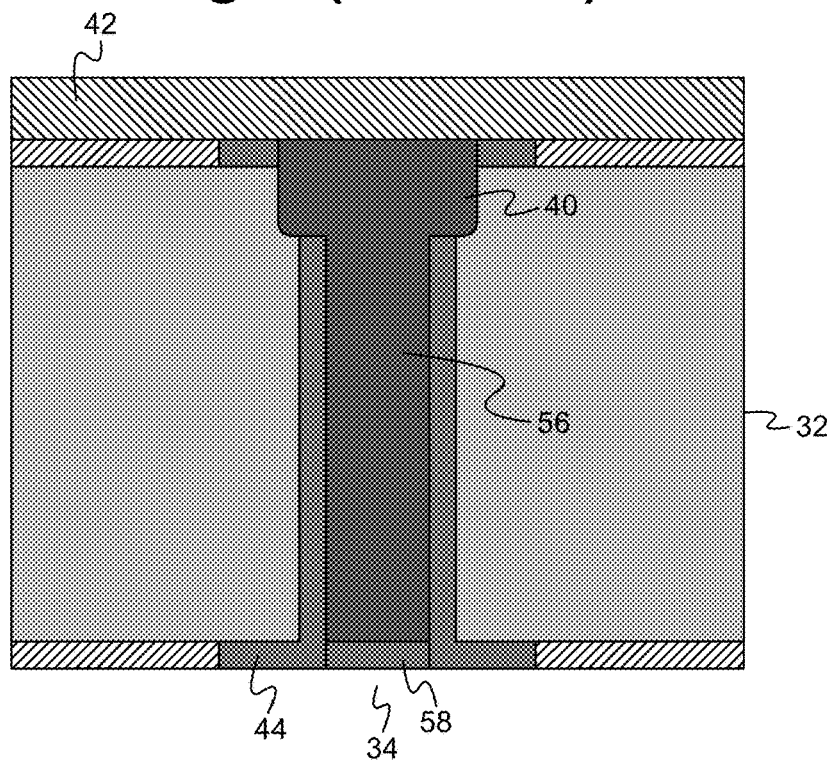
FIG. 5 illustrates the PCB of FIG. 3 with the back drilled hole and the remainder of the via completely filled with epoxy.
Figure 6:
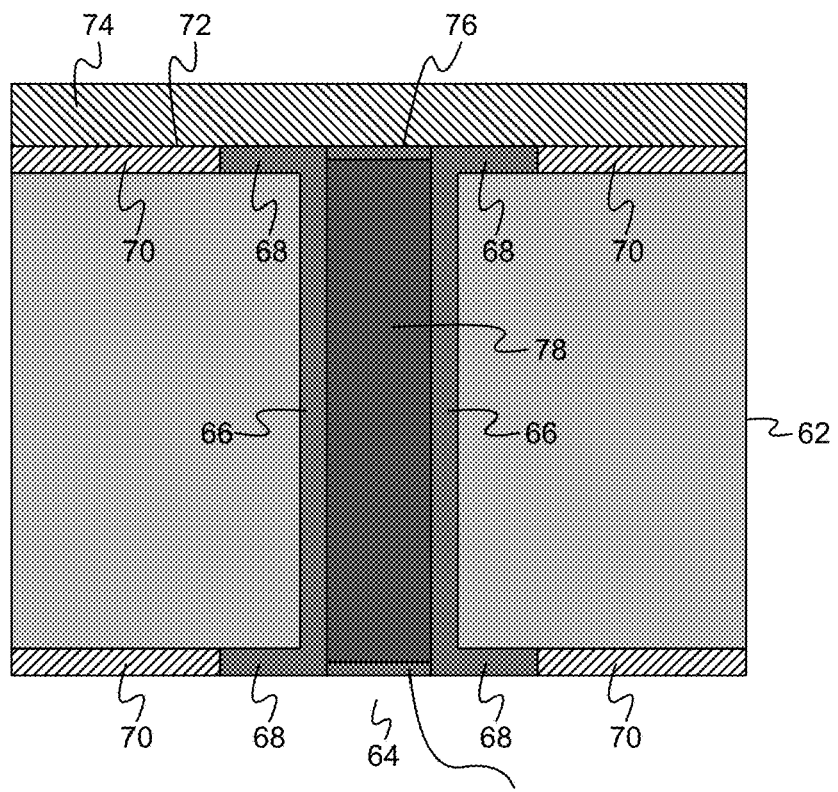
FIG. 6 illustrates a cut out side view of a portion of a PCB with a heat sink attached where the PCB is configured with VIPPO (Via-In-Pad Plated Over) design according to some embodiments.

FIG. 6 illustrates a cut out side view of a portion of a PCB with a heat sink attached where the PCB is configured with VIPPO (Via-In-Pad Plated Over) design according to some embodiments. The PCB 62 includes a plurality of stacked layers, the layers made of non-conductive layers and conductive layers. For simplicity, the individual stacked layers of the PCB are not shown. The non-conductive layers can be made of prepreg or base material that is part of a core structure. A core structure includes a non-conductive layer, such as a base material, and a conductive layer on one or both opposing surfaces of the non-conductive layer. The conductive layer can be selectively patterned to form conductive interconnects. A laminated stack is formed by stacking multiple core structures with intervening prepreg and then laminating the stack. Any conventional lamination technique can be used.

The PCB 62 includes a plated through hole via 64. The plated through hole via 64 has a VIPPO design. In particular, the plated through hole via 64 has via side wall plating 66 and is filled with insulating material 78, such as epoxy resin. The via side wall plating 66 may interconnect with select conductive layers with the PCB 62. An annular ring 68 is formed on the back side of the PCB 62, which is mechanically and electrically interconnected to the via side wall plating 66, and an annular ring 68 is formed on the front side of the PCB 62, which is mechanically and electrically interconnected to the via side wall plating 66. A conductive cap 76 is formed over the annular ring 88 and via opening on both the front and back sides of the PCB 62. A heat sink 74 is attached to the back side of the PCB 62 by thermally conductive adhesive 72. The VIPPO configuration of PCB 62 can be used for thermal heat transfer or grounding. However, the VIPPO configuration does not enable the plated through hole via 64 to be used as a signal carrying via due to its electrical interconnection with the heat sink 74. The plated through hole via 64 is effective as a thermal via effectuating heat transfer from the PCB to the heat sink.

The VIPPO configuration of FIG. 6 can be modified to remove the annular ring on the back side of the PCB, and then cover this etched area with an insulating material such as soldermask. This eliminates physical and electrical contact between the plated through hole via and the copper heat sink.

Figure 7:
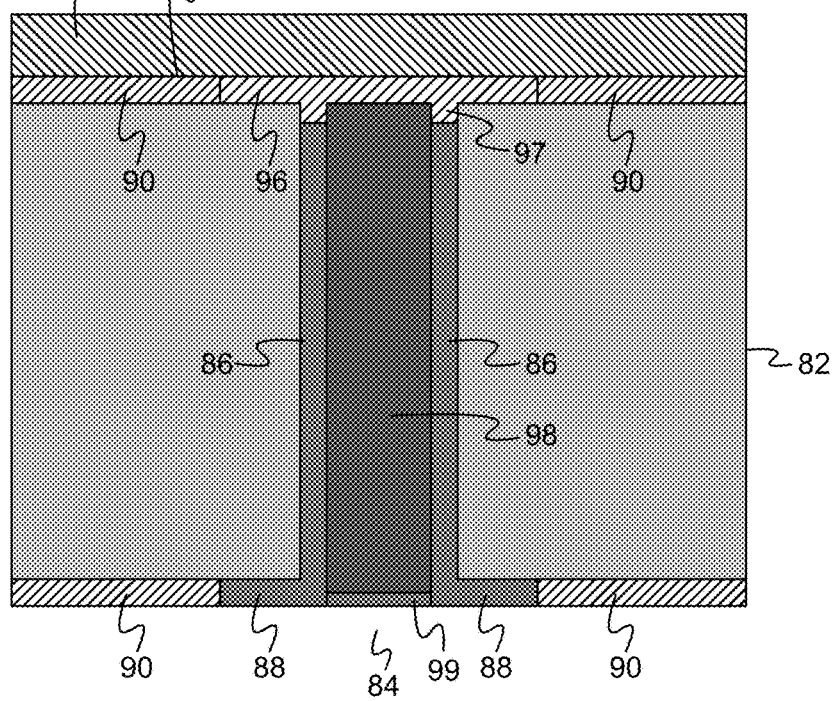
FIG. 7 illustrates a cut out side view of a portion of a PCB with a heat sink attached where the PCB is configured with landless vias according to some embodiments.

FIG. 7 illustrates a cut out side view of a portion of a PCB with a heat sink attached where the PCB is configured with landless vias according to some embodiments. The PCB 82 includes a plurality of stacked layers, the layers made of non-conductive layers and conductive layers, similar to the PCB 62 in FIG. 6. For simplicity, the individual stacked layers of the PCB are not shown. The non-conductive layers can be made of prepreg or base material that is part of a core structure. A core structure includes a non-conductive layer, such as a base material, and a conductive layer on one or both opposing surfaces of the non-conductive layer. The conductive layer can be selectively patterned to form conductive interconnects. A laminated stack is formed by stacking multiple core structures with intervening prepreg and then laminating the stack. Any conventional lamination technique can be used.

The PCB 82 includes a plated through hole via 84. The plated through hole via 84 has a modified VIPPO design. In particular, the plated through hole via 84 has via side wall plating 86 and is filled with insulating material 98, such as epoxy resin. The via side wall plating 86 may interconnect with select conductive layers with the PCB 82. The front side configuration of the plated through hole via 84 has a VIPPO design in that an annular ring 88 is formed on the front side of the PCB 82, which is mechanically and electrically interconnected to the via side wall plating 86, and a conductive cap 99 is formed over the insulating material 98 and annular ring 88. However, the back side configuration does not have a VIPPO design. Instead, conductive material that would have formed an annular ring is etched away, and a conductive cap is not added, resulting in a back side configuration lacking conductive material at the outer layer of the plated through hole via 84. In some embodiments, etching away of the conductive material that would have formed an annular ring also results in etching away of the proximate portion of the side wall plating, resulting in an area void of side wall plating, such as area 97. In the place of the removed conductive material, an insulating material 96, 97, such as soldermask, is applied, forming an insulation cap over the back side portion of the plated through hole via 84. In this manner, conductive material of the plated through hole via 84 is electrically isolated from a heat sink attached to the back side of the PCB 82. As such, the plated through hole via 84 is viable as a signal carrying via. In some embodiments, the heat sink is made of copper. Soldermask 90 is applied between the conductive interconnects (not shown) that form the outer layer. At least a top surface of the conductive interconnects is left exposed from the applied soldermask. A heat sink 94 is attached to the backside of the PCB 82 by thermally conductive adhesive 92. The heat sink 94 is thermally coupled to the exposed surface of the conductive interconnects from on the outer layer of the PCB 82.

It is understood that only a portion of the PCB is shown in FIG. 7, the portion showing a single plated through hole via positioned under a footprint of the heat sink, which is also only shown in partial. It is further understood that certain features of the PCB are not shown for simplicity or lack of scale, such as the individual layers within the PCB stack up, interconnection of internal conductive layers to the plated through hole via and the patterned interconnects formed on the outer layer of either the front side or back side of the PCB stack up. It is further understood that the various structural configurations and the position of the vias and outer layer conductive interconnects can be different than those shown in the embodiments of FIGS. 6-7. It is also understood, that only a single plated through hole via configured as a signal carrying via is shown in FIG. 7 and that any number of plated through hole vias of the type of plated through hole via 84 can be configured within the footprint of the heat sink. It is also understood that the PCB 82 can additionally be configured to also include one or more thermal vias of similar type as the plated through hole via 64 shown in FIG. 6 positioned within a footprint of the heat sink.

Figure 8:
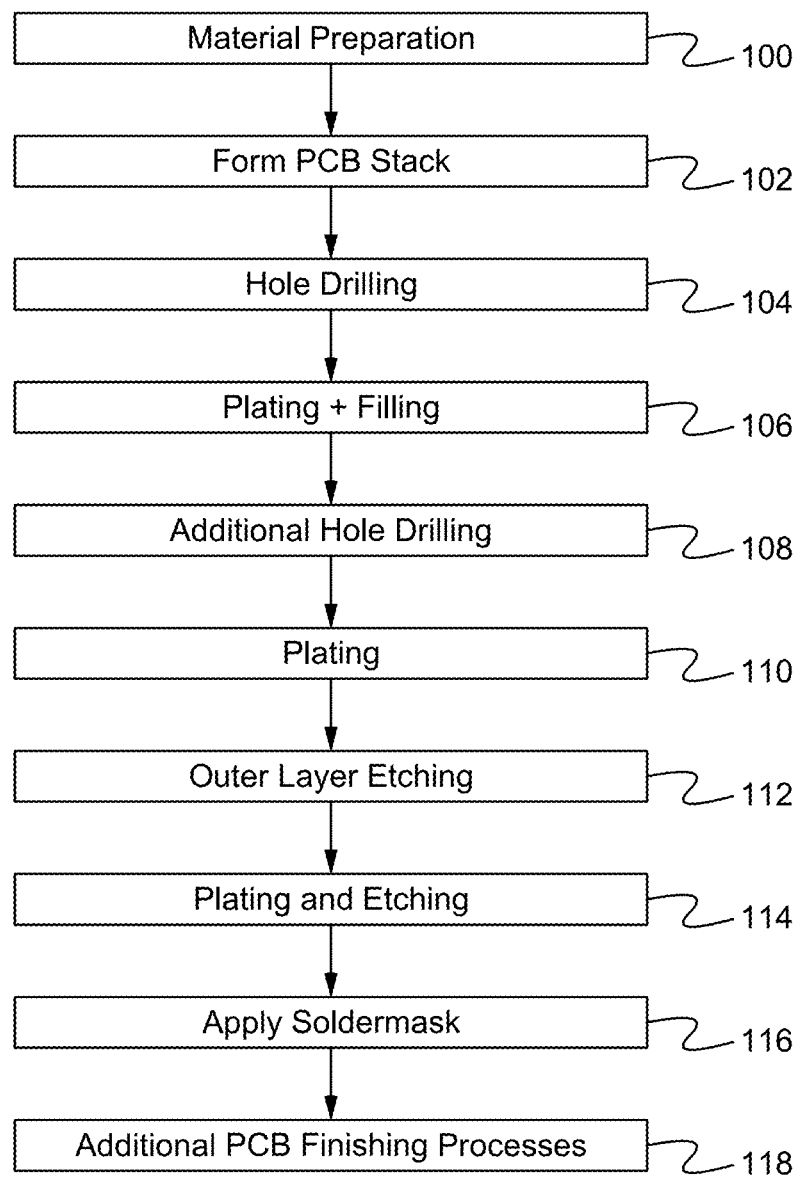
FIG. 8 illustrates a method of making a printed circuit board with landless via according to some embodiments.

FIG. 8 illustrates a method of making a printed circuit board with landless via according to some embodiments. At the step 100, materials are prepared for each separate layer to be formed into the PCB stack up. This step is typically referred to as a material cut step. The various layers include non-conductive layers and conductive layers.

At the step 102 the layers are stacked and laminated together to form a laminated PCB stack. The layers can be stacked and laminated over a series of sequential stack and lamination steps, including patterning of conductive interconnect layers and via formation as is well known in the art. It is understood that the patterning of conductive interconnect layers and via formation can be performed as part of step 100, prior to stacking and lamination, or some combination of steps 100 and 102. Alternatively, the entire stack can be laminated in a single lamination step.

At the step 104, one or more through hole vias are drilled through the laminated stack formed at the step 102. A desmear process is performed to remove residue, such as residual particles from the drilling of the through hole vias. At the step 106, the drilled through hole vias are plated. In some embodiments, copper is used as the plating material. It is understood that other plating materials can be used. The plating in each through hole via may form an interconnect with one or more various conductive layers within the PCB. The plated through hole vias are filled with an insulating material. An example of filling material includes, but is not limited to, epoxy resin. In some embodiments, filling the plated through hole vias with insulating material is an optional step. In such applications, the plated through hole vias remain unfilled with insulating material.

At the step 108, additional through hole vias that are not to be filled with an insulating material are drilled. These additional through hole vias are part of the printed circuit board design not within the footprint of the copper heat sink. At the step 110, the additional through hole vias drilled at the step 108 are plated to form plated through hole vias. In some embodiments, the drilling step 108 can be combined with drilling step 104, and the plating step 110 can be combined with plating step 106. In such applications, there may not be a need for second separate drilling and plating steps, in which case separate steps 108 and 110 are not needed. Such embodiments may result in applications, for example, where all vias are filled or if a selective via filling process is used where only select vias are filled and remaining vias are unfilled during the step 106.

At the step 112, the outer conductive layers of the laminated stack are patterned etch. The front side outer conductive layer is patterned etched to form conductive interconnects and conductive annular rings surrounding appropriate plated through hole vias. The back side outer conductive layer is patterned etched to form conductive interconnects, as well as to remove conductive material surrounding the plated through hole vias formed in steps 104 and 106 such that there is no annular ring connected to each of these plated through hole vias. Such plated through hole vias are intended as signaling vias within the footprint of a subsequently mounted heat sink. Back side outer layer etching of the conductive material that would have formed an annular ring also results in removal of the through hole via side wall plating proximate the outer layer, such as side wall plating portion 97 shown in FIG. 7.

At the step 114, optional steps of plating and etching are performed. In some applications, certain outer layer conductive interconnects are to have greater thickness than that formed during the steps 110 and 112, such as for through hole vias that function as thermally conducting vias. Accordingly, additional plating is selectively applied to those certain interconnects and appropriate etching is performed. In some embodiments, the front side annular ring is plated according to a VIPPO design so as to form a conductive cap over the plated through hole via.

At the step 116, soldermask is applied onto the etched portions of the outer layer so that soldermask fills the gaps between the patterned interconnects, such as soldermask 90 shown in FIG. 7, including the area surrounding and above the plated through hole vias formed in steps 104 and 106, shown as soldermask 96 and 97 in FIG. 7. It is understood that insulating material other than soldermask can be used in sections 96 and 97. In some embodiments, the soldermask is either co-planar with an outermost surface of the patterned interconnects in the outer layer, or recessed (below) an outermost surface of the patterned interconnects in the outer layer such that the attached heat sink is in contact with the outer layer patterned interconnects.

At the step 118, additional finishing processes are performed to complete the manufacturing of the printed circuit board. Examples of additional finishing processes include, but are not limited to, adding a surface finish, performing electrical testing, and routing the printed circuit board outline. Once the PCB is completed, a heat sink can be mounted to the PCB back side over the landless via.

The printed circuit board with landless vias eliminates back drilling, which saves running cost and shortens PCB processing time. Elimination of a back drilling step also conserves useable real estate on the printed circuit board as the physical size of the drill bit requires additional spacing of adjacently drilled holes.

The present application has been described in terms of specific embodiments incorporating details to facilitate the understanding of the principles of construction and operation of the printed circuit board with landless vias. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:
1. An electronic device comprising:
   a. a circuit board comprising:
      i. a plurality of stacked layers, wherein the plurality of stacked layers comprise a first outer layer surface and an opposing second outer layer surface;
      ii. a via formed through the plurality of stacked layers from the first outer layer surface to the second outer layer surface, wherein side walls of the via are plated with conductive material from the first outer layer surface to at least proximate the second outer layer surface, wherein a portion of the via side wall adjacent the second outer layer surface is vacant of side wall plating;
      iii. a conductive annular ring on the first outer layer surface, the conductive annular ring surrounding the via and coupled to the side wall plating of the via; and
      iv. an insulating layer on the second outer layer surface and covering an end of the via at the second outer layer surface; and
   b. a heat sink coupled to the insulating layer and to the second outer layer surface.
2. The electronic device of claim 1 wherein the insulating layer extends into the portion of the via side wall adjacent the second outer surface.

3. The electronic device of claim 1 wherein the via is filled with an insulating material.

4. The electronic device of claim 3 further comprising a conductive cap coupled to the conductive annular ring and covering an end of the via at the first outer layer surface.

5. The electronic device of claim 3 wherein the insulating material comprises an epoxy resin.

6. The electronic device of claim 1 wherein each of the conductive layers is pattern etched.

7. An electronic device comprising:
   a. a circuit board comprising:
      i. a laminated stack comprising a plurality of non-conducting layers and a plurality of conductive layers, wherein the laminated stack further comprises a first outer layer surface and an opposing second outer layer surface having a plurality of patterned conductive interconnects;
      ii. a via formed through the laminated stack from the first outer layer surface to the second outer layer surface, wherein side walls of the via are plated with conductive material from the first outer layer surface to proximate the second outer layer surface;
      iii. a conductive annular ring on the first outer layer surface, the conductive annular ring surrounding the via and coupled to the side wall plating of the via; and
      iv. an insulating layer on the second outer layer surface and laterally between the plurality of patterned conductive interconnects, at least a first surface of the plurality of patterned conductive interconnects are exposed from the insulating layer, wherein the insulating layer covers the via; and
   b. a heat sink coupled to the insulating layer and to the exposed first surface of the plurality of patterned conductive interconnects.

8. The electronic device of claim 7 wherein a portion of the via side wall adjacent the second outer layer surface is vacant of side wall plating.

9. The electronic device of claim 8 wherein the insulating layer extends into the portion of the via side wall adjacent the second outer surface.

10. The electronic device of claim 7 wherein the via is filled with an insulating material.

11. The electronic device of claim 10 wherein the insulating material comprises an epoxy resin.

12. The electronic device of claim 10 further comprising a conductive cap coupled to the conductive annular ring and covering an end of the via at the first outer layer surface.

13. The electronic device of claim 7 wherein each of the conductive layers is pattern etched.

14. The electronic device of claim 7 wherein the via side wall plating forms electrical interconnections with conductive layers intersecting the via.

15. A method of manufacturing a circuit board comprising:
   a. forming a circuit board having a plurality of stacked layers, wherein the plurality of stacked layers comprises a first outer conductive layer and an opposing second outer conductive layer;
   b. forming a through hole via through the plurality of stacked layers;
   c. plating side walls of the through hole via;
   d. patterning the first outer conductive layer to form a conductive annular ring surrounding the via and coupled to the side wall plating of the via;
   e. patterning the second outer conductive layer to remove conductive material overlapping an end of the via at the second outer conductive layer such that side wall plating of the via is disconnected from the second outer conductive layer;
   f. applying an insulation material at the end of the via at the second outer conductive layer to form an insulation cap; and
   g. mounting a heat sink to the second outer conductive layer, wherein a position of the heat sink overlaps the via.

16. The method of claim 15 further comprising filling the plated through hole via with an insulating material.

17. The method of claim 16 further comprising forming a conductive cap to the conductive annular ring, wherein the conductive cap covers an end of the via.

18. The method of claim 15 wherein the first outer conductive layer is pattern etched and the second outer conductive layer is pattern etched.

19. An electronic device comprising:
   a. a circuit board comprising:
      i. a plurality of stacked layers, wherein the plurality of stacked layers comprise a first outer layer surface and an opposing second outer layer surface;
      ii. a via formed through the plurality of stacked layers from the first outer layer surface to the second outer layer surface, wherein side walls of the via are plated with conductive material from the first outer layer surface to at least proximate the second outer layer surface, wherein the via is filled with an insulating material;
      iii. a conductive annular ring on the first outer layer surface, the conductive annular ring surrounding the via and coupled to the side wall plating of the via; and
      iv. an insulating layer on the second outer layer surface and covering an end of the via at the second outer layer surface; and
   b. a heat sink coupled to the insulating layer and to the second outer layer surface.

20. The electronic device of claim 19 wherein the insulating material comprises an epoxy resin.

21. The electronic device of claim 20 further comprising a conductive cap coupled to the conductive annular ring and covering an end of the via at the first outer layer surface.

* * * * *